United States Patent
Wu et al.

(10) Patent No.: US 11,133,322 B2
(45) Date of Patent: Sep. 28, 2021

(54) DUAL-PORT STATIC RANDOM ACCESS MEMORY CELL LAYOUT STRUCTURE

(71) Applicant: SHANGHAI HUALI INTEGRATED CIRCUIT CORPORATION, Shanghai (CN)

(72) Inventors: Dongcheng Wu, Shanghai (CN); Maocheng Fan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 16/942,544

(22) Filed: Jul. 29, 2020

(65) Prior Publication Data
US 2021/0202494 A1 Jul. 1, 2021

(30) Foreign Application Priority Data
Dec. 25, 2019 (CN) .......................... 201911352471.8

(51) Int. Cl.
*G11C 11/419* (2006.01)
*H01L 27/11* (2006.01)
*G11C 11/412* (2006.01)

(52) U.S. Cl.
CPC ........ *H01L 27/1104* (2013.01); *G11C 11/412* (2013.01); *G11C 11/419* (2013.01)

(58) Field of Classification Search
CPC .. G11C 11/419; G11C 11/412; H01L 27/1104
USPC ................................................ 365/154, 205
See application file for complete search history.

(56) References Cited

U.S. PATENT DOCUMENTS

| 6,341,083 B1* | 1/2002 | Wong ..................... G11C 11/412 365/154 |
| 6,980,462 B1* | 12/2005 | Ramesh ................. G11C 5/063 257/E27.081 |
| 7,006,370 B1* | 2/2006 | Ramesh ................ G11C 11/412 257/E27.099 |
| 9,646,974 B1* | 5/2017 | Liaw ...................... G11C 11/412 |
| 2001/0043487 A1* | 11/2001 | Nii ........................... G11C 7/18 365/154 |
| 2009/0059640 A1* | 3/2009 | Funane ................. G11C 7/1075 365/51 |
| 2009/0059657 A1* | 3/2009 | Cannon ............... G11C 11/4125 365/163 |

(Continued)

*Primary Examiner* — Michael T Tran
(74) *Attorney, Agent, or Firm* — Alston & Bird LLP

(57) ABSTRACT

The disclosure provides a dual-port static random access memory cell layout structure, including a pull-down transistor layout structure, a first and a second pass transistor layout structure. Each of them includes an active region pattern and a polysilicon pattern; and contact hole patterns. The active region pattern of the pull-down transistor layout structure and the first pass transistor layout structure are connected together, and share the contact hole pattern at one end. The active region pattern of the pull-down transistor layout structure and the second pass transistor layout structure are connected together, and share the contact hole pattern at the other end. The disclosure optimizes the dual-port static random access memory cell layout structure, improves the influence of the optical fillet effect on device matching, strengthens the performance including read-write crosstalk of the pull-down transistor under the situation of the same area, and increases the read current.

14 Claims, 3 Drawing Sheets

(56) References Cited

U.S. PATENT DOCUMENTS

| | | | |
|---|---|---|---|
| 2011/0075470 A1* | 3/2011 | Liaw | H01L 27/105 |
| | | | 365/154 |
| 2011/0157965 A1* | 6/2011 | Nii | G11C 11/4125 |
| | | | 365/156 |
| 2013/0026580 A1* | 1/2013 | Morimoto | G11C 11/412 |
| | | | 257/369 |
| 2014/0191338 A1* | 7/2014 | Nii | G11C 11/412 |
| | | | 257/401 |
| 2016/0043092 A1* | 2/2016 | Mojumder | H01L 29/1054 |
| | | | 257/369 |
| 2016/0190141 A1* | 6/2016 | Lee | H01L 29/41791 |
| | | | 257/390 |
| 2016/0372182 A1* | 12/2016 | Liaw | G11C 5/063 |
| 2020/0106441 A1* | 4/2020 | Liaw | H01L 27/0207 |
| 2020/0135742 A1* | 4/2020 | Lo | H01L 27/0207 |
| 2021/0065784 A1* | 3/2021 | Braceras | G11C 11/417 |
| 2021/0082477 A1* | 3/2021 | Jain | H03K 3/356104 |
| 2021/0082776 A1* | 3/2021 | Wong | H01L 27/1104 |
| 2021/0090640 A1* | 3/2021 | Li | G11C 11/417 |
| 2021/0091098 A1* | 3/2021 | Tsukamoto | G11C 11/412 |

* cited by examiner

DUAL-PORT STATIC RANDOM ACCESS MEMORY CELL LAYOUT STRUCTURE

CROSS-REFERENCES TO RELATED APPLICATIONS

This application claims the priority to Chinese patent application No. CN201911352471.8, filed at CNIPA on Dec. 25, 2019, and entitled "DUAL-PORT STATIC RANDOM ACCESS MEMORY CELL LAYOUT STRUCTURE", the disclosure of which is incorporated herein by reference in entirety.

TECHNICAL FIELD

This disclosure relates to the field of semiconductor manufacturing, in particular to static random access memory (SRAM).

BACKGROUND

Static random-access memory (SRAM) is a type of random-access memory (RAM) that uses latching circuitry (flip-flop) to store each bit. SRAM retains data bits in its memory as long as power is being supplied. Unlike dynamic RAM (DRAM), which stores bits in cells consisting of a capacitor and a transistor, SRAM does not have to be periodically refreshed. Dual-port static random access memory cells are widely used in semiconductor devices. Static random-access memory (SRAM) is a type of random-access memory (RAM) that uses latching circuitry (flip-flop) to store each bit. In order to ensure that the design of device transistors comply with the structural rules, disadvantages are avoided as much as possible. Referring to FIG. 1, which is an exemplary SRAM cell layout. In the layout structure of this traditional dual-port SRAM cell, 01 represents an active region, 02 represents the polysilicon pattern, 03 represents a contact hole pattern, 05 represents a pull-down transistor including an active region, a polysilicon pattern and a contact hole pattern, 04 represents a first pass transistor including an active region, a polysilicon pattern and a contact hole pattern, and 06 represents a second pass transistor including an active region, a polysilicon pattern and a contact hole pattern. The polysilicon pattern of the pull-down transistor 05 and the active region of the second pass transistor 06 need to be connected together through a shared contact, in this case contact hole 03 (i.e., connected together with a gate of an inverter to an internal node at the other end). This shared contact has a high risk in the fabrication process. After the optical proximity correction (OPC) of the traditional dual-port SRAM cell, FIG. 2 illustrates an OPC simulation diagram of a traditional dual-port SRAM cell, it is influenced by the optical fillet effect, such that device matching is influenced.

Therefore, it is needed to provide a novel dual-port SRAM layout structure to solve the above problem.

BRIEF SUMMARY

In view of the disadvantages of the dual-port current SRAM, the purpose of the disclosure is to provide a dual-port SRAM cell layout structure, which is used to solve the problem that, after optical proximity correction, the traditional dual-port SRAM cell in the prior art is influenced by the optical fillet effect, such that device matching is influenced.

One embodiment of the disclosure includes a dual-port static random access memory cell layout structure, comprising: a pull-down transistor layout structure, comprising a pull-down active region pattern, a pull-down polysilicon pattern, and a pull-down contact hole pattern, wherein the pull-down polysilicon pattern crosses the pull-down active region pattern, wherein the pull-down contact hole pattern is located in the pull-down active region pattern and distributed on one side of the pull-down polysilicon pattern; a first pass transistor layout structure, comprising a first active region pattern, a first polysilicon pattern, and a first contact hole pattern, wherein the first polysilicon pattern crosses the first active region pattern, wherein the first contact hole pattern is located in the first active region pattern and distributed on one side of the first polysilicon pattern; and a second pass transistor layout structure, comprising a second active region pattern, a second polysilicon pattern, and a second contact hole pattern, wherein the second polysilicon pattern crosses the second active region pattern, wherein the second contact hole pattern is located in the second active region pattern and distributed on one side of the second polysilicon pattern; wherein the pull-down active region pattern of the pull-down transistor layout structure and the first active region pattern of the first pass transistor layout structure are connected together and the pull-down contact hole pattern and the first contact hole pattern are shared at one end; and wherein the pull-down active region pattern of the pull-down transistor layout structure and the second active region pattern of the second pass transistor layout structure are connected together and the pull-down contact hole pattern and the second contact pattern are shared at another end.

According to some examples, the first active region pattern of the first pass transistor layout structure and the second active region pattern of the second pass transistor layout structure are respectively located on the two sides below the pull-down active region pattern of the pull-down transistor layout structure.

According to some examples, the pull-down contact hole patterns of the pull-down transistor layout structure are distributed above and below the pull-down polysilicon pattern of the pull-down transistor layout structure.

According to some examples, the number of the pull-down contact hole patterns distributed above the pull-down polysilicon pattern of the pull-down transistor layout structure is one.

According to some examples, a number of contact hole patterns distributed below the pull-down polysilicon pattern of the pull-down transistor layout structure is two, and wherein the two contact hole patterns are respectively shared by the first pass transistor layout structure and the second pass transistor layout structure.

According to some examples, the first polysilicon pattern of the first pass transistor layout structure and the second pass transistor layout structure are connected together outside the first and the second active regions respectively and are covered with polysilicon cutoff patterns.

According to some examples, the first contact hole patterns above the first polysilicon patterns of the first pass transistor layout structure and the second contact hole patterns above the second polysilicon second pass transistor layout structure are respectively shared with the pull-down transistor layout structure, and wherein a number of contact holes below the first polysilicon pattern of the first pass transistor layout structure is one; and wherein a number of contact holes below the second polysilicon pattern of the second pass transistor layout structure is one.

According to some examples, the pull-down active region pattern of the pull-down transistor layout structure, the first active region pattern of the first pass transistor layout structure, and the second active region pattern of the second pass transistor layout structure are active region patterns of a static random access memory (SRAM) structure.

According to some examples, each of the active region patterns of the pull-down transistor layout structure, the first active region pattern of the first pass transistor layout structure and the second active region pattern of the second pass transistor layout structure comprises a plurality of strip structures intersecting with respective polysilicon patterns.

DETAILED DESCRIPTION OF THE DISCLOSURE

The embodiments of the disclosure will be described below through specific embodiments. Those skilled in the art may easily understand other advantages and effects of the disclosure from the contents disclosed in the description. The disclosure may also be implemented or applied in other different specific modes. Various details in the description may also be modified or changed without departing from the spirit of the disclosure based on different points of view and applications.

FIG. 3 to FIG. 6 will be described in the following paragraphs. It should be noted that the drawings provided in the embodiments are only used for schematically illustrating the basic concept of the disclosure, only illustrate the components related to the disclosure, and are not drawn according to the number, shape and size of the components in actual implementation. The type, number and scale of the components in actual implementation may be freely changed, and the layout of the components may be more complex.

Embodiment 1

Figure 1:
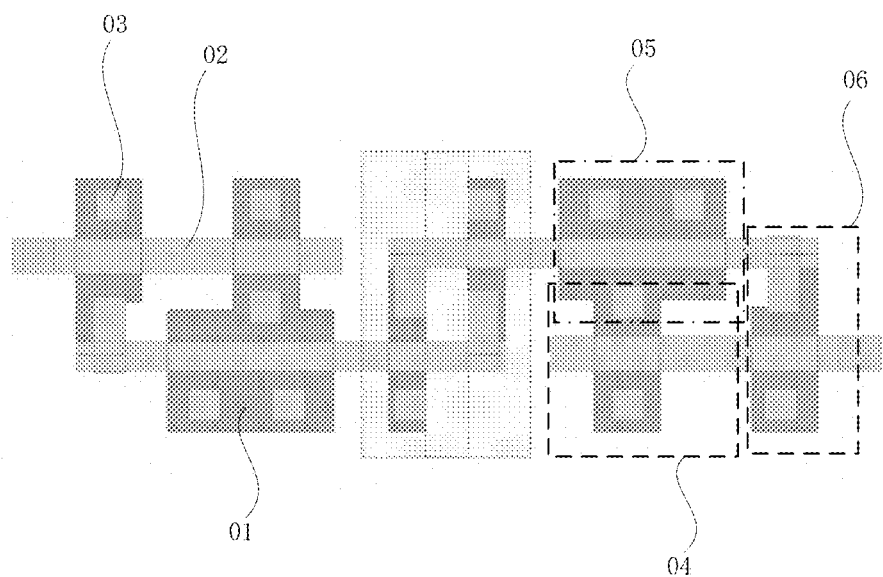
FIG. 1 illustrates a schematic diagram of a dual-port SRAM cell layout structure in the current devices.
Figure 2:
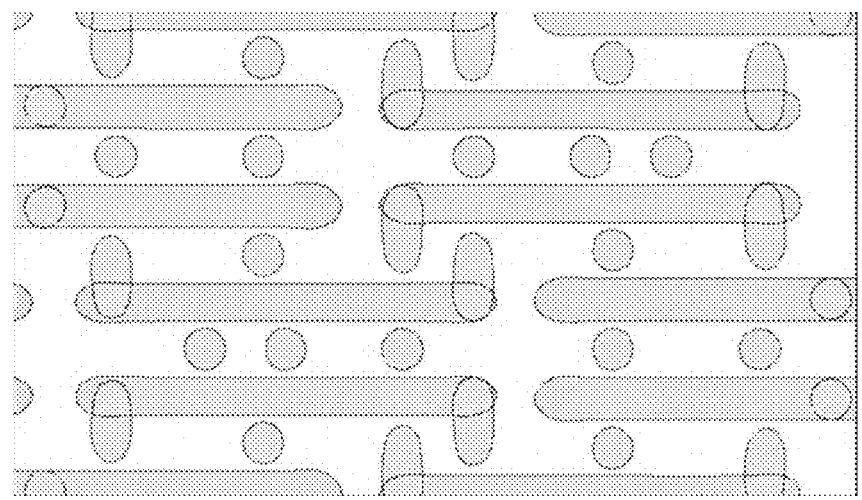
FIG. 2 illustrates the post optical proximity correction of a section of the layout structure for the SRAM device in FIG. 1.
Figure 3:
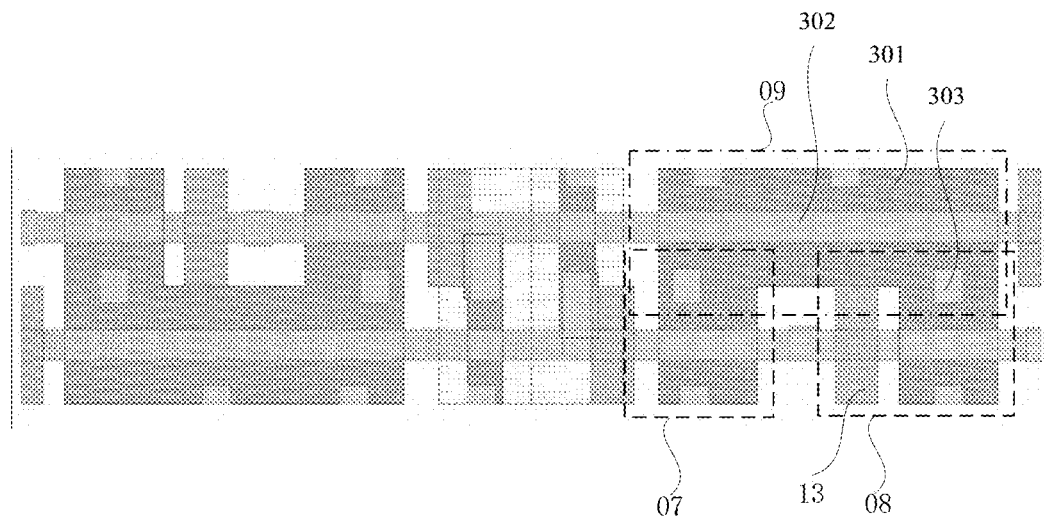
FIG. 3 illustrates a schematic diagram of a dual-port SRAM cell layout structure according to the disclosure.

The disclosure provides a dual-port SRAM cell layout structure. FIG. 3 illustrates a dual-port SRAM cell layout structure according to the disclosure, the layout structure includes a pull-down transistor layout structure 09, a first pass transistor layout structure 07, and a second pass transistor layout structure 08. Each of the pull-down transistor layout structure 09, the first pass transistor layout structure 07, and the second pass transistor layout structure 08 includes an active region pattern 301 and a polysilicon pattern 302 crossing the active region pattern 301; and contact hole patterns 303 located on the active region pattern 301 and distributed on the two sides of the polysilicon pattern 302. That is to say, the pull-down transistor layout structure 09 consists of at least the active region pattern 301, the polysilicon pattern 302 and the contact hole pattern 303; the first pass transistor layout structure 07 consists of at least the active region pattern 301, the polysilicon pattern 302 and the contact hole pattern 303; the second pass transistor layout structure 08 consists of at least the active region pattern 301 and the polysilicon pattern 302 and the contact hole pattern 303.

In the disclosure, the active region pattern 301 of the pull-down transistor layout structure 09 and the active region pattern 301 of the first pass transistor layout structure 07 are connected together, and share the contact hole pattern 303 at one end. In other words, the pull-down transistor layout structure 09 and the first pass transistor layout structure 07 share the contact hole pattern 303 at one end. In addition, the active region pattern 301 of the pull-down transistor layout structure 09 and the active region pattern 301 of the second pass transistor layout structure 08 are connected together, and share the contact hole pattern at the other end. In other words, the pull-down transistor layout structure 09 and the second pass transistor layout structure 08 share the contact hole pattern 303 at the other end.

Further, in the disclosure, the active region pattern 301 of the first pass transistor layout structure 07 and the active region pattern of the second pass transistor layout structure 08 are respectively located on the two sides below the active region pattern 301 of the pull-down transistor layout structure 09. Since the active region pattern 301 of the first pass transistor layout structure 07 is connected with the active region pattern 301 of the pull-down transistor layout structure 09 and the active region pattern 301 of the second pass transistor layout structure 08 is connected with the active region pattern 301 of the pull-down transistor layout structure 09, when the active region pattern 301 of the first pass transistor layout structure 07 and the active region pattern of the second pass transistor layout structure 08 are respectively located on the two sides below the active region pattern 301 of the pull-down transistor layout structure 09, the active regions of the pull-down transistor layout structure, the first pass transistor layout structure and the second pass transistor layout structure form a bottomless-square-shaped pattern structure illustrated in FIG. 3.

Further, in the disclosure, the contact hole patterns 303 of the pull-down transistor layout structure 09 are distributed above and below the polysilicon pattern 302 of the pull-down transistor layout structure 09. In the disclosure, the polysilicon pattern of the pull-down transistor layout structure 09 is a strip structure placed horizontally. It can be seen from FIG. 3 that the polysilicon pattern 302 crosses the active region 301 of the pull-down transistor layout structure 09, and the contact hole patterns 303 of the pull-down transistor layout structure 09 are distributed on the two sides of the polysilicon pattern 302 on the active region 301. Therefore, in the pull-down transistor layout structure 09, the contact hole 303 is distributed above and below the polysilicon pattern 302 on the active region. Further, in the disclosure, the number of the contact hole pattern distributed above the polysilicon pattern of the pull-down transistor layout structure is one. Further, in the disclosure, the number of the contact hole patterns distributed below the polysilicon pattern of the pull-down transistor layout structure 09 is two, and the two contact hole patterns are respectively the contact hole patterns shared with the first pass transistor layout structure and the second pass transistor layout structure. Further, the contact hole patterns above the polysilicon patterns of the first pass transistor layout structure and the second pass transistor layout structure are respectively shared with the pull-down transistor layout structure, and the number of contact holes below the polysilicon patterns of the first pass transistor layout structure and the second pass transistor layout structure is respectively one. In addition, the two contact hole patterns are respectively located above the polysilicon patterns of the first pass transistor layout structure and the second pass transistor layout structure. Referring to FIG. 3, in other words, the two contact hole patterns 303 below the polysilicon pattern of the pull-down transistor layout structure 09 are respectively located on the active regions of the first pass transistor layout structure and the second pass transistor layout structure. Since the contact hole patterns of the first pass transistor and the second pass transistor are respectively distributed on the two sides of respective polysilicon pattern, while the polysilicon patterns of the first pass transistor and the second pass transistor respectively cross respective active regions, the contact hole patterns of the first pass transistor and the second pass transistor are respectively located above and below respective polysilicon patterns. In the disclosure, referring to FIG. 3, the polysilicon patterns of the first pass transistor layout structure and the second pass transistor layout structure are connected together, and connected regions outside respective active regions are covered with polysilicon cutoff patterns 13.

Figure 5:
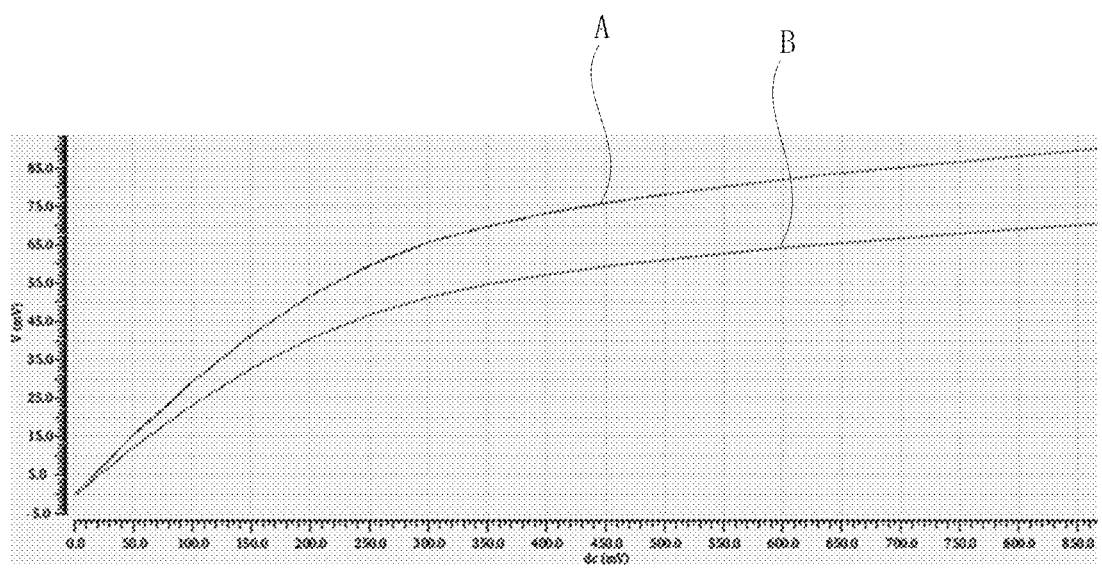
FIG. 5 illustrates a comparison data plot of the read-state voltages of internal nodes between the traditional bistatic random access memory (bi-SRAM) cell structure and the bi-SRAM cell using a layout structure according to the disclosure.

FIG. 5 illustrates a comparison data plot of the read-state voltages of internal nodes between the traditional bi-SRAM cell structure and the bi-SRAM cell using a layout structure according to the disclosure. Here curve A is the internal node voltage of the traditional bi-SRAM cell structure; and curve B is the internal node voltage of the bi-SRAM cell structure in the disclosure. As shown the internal node voltage obtained by adopting the layout structure in the disclosure is smaller for the same area. A smaller internal node voltage provides a more conducive device, thus improving the static noise margin.

Embodiment 2

Figure 4:
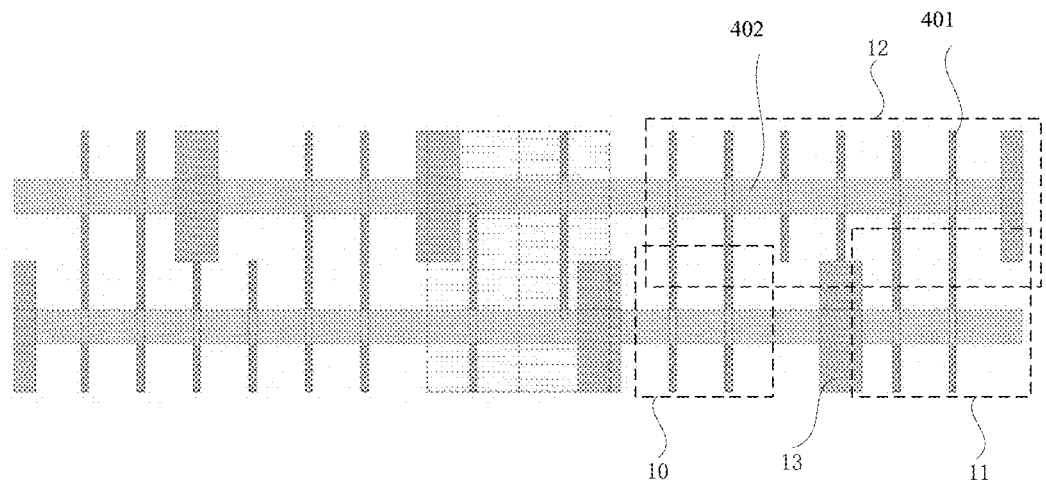
FIG. 4 illustrates a layout diagram for an SRAM structure with a fin gate according to the disclosure.

As another embodiment of the disclosure, the active region patterns of the pull-down transistor layout structure, the first pass transistor layout structure and the second pass transistor layout structure are active region patterns of an SRAM structure. FIG. 4 illustrates a layout diagram for an SRAM structure with a fin gate according to the disclosure. Further, in FIG. 4, the active region patterns 401 of all transistors, including the pull-down transistor layout structure 12, the first pass transistor layout structure 10 and the second pass transistor layout structure 11 are formed of a number of strip structures which intersect with respective polysilicon patterns 402. In other words, the active region pattern of the pull-down transistor layout structures include these strip structures. The strip structures are uniformly displaced. The polysilicon pattern 402 of the pull-down transistor layout structure 12 crosses the uniformly displaced strips shaped active regions 401. These strip-shaped active regions intersect with the polysilicon patterns 402.

In the SRAM layout structure of a fin gate, referring to FIG. 4, the active region patterns 401 of the first pass transistor layout structure 10 and the second pass transistor layout structure 11 are formed with a number of equally spaced strip structures. In addition, the active regions 401a of the first pass transistor layout structure 10 (the active region pattern of the strip structures) and the active region 402c of the pull-down transistor layout structure 12 (the active region pattern of the strip structures) are electrically connected; the active region 401b of the second pass transistor layout structure 11 (the active region pattern of the strip structures) and the active region pattern 401c of the pull-down transistor layout structure 12 (the active region pattern of the strip structures) are electrically connected together.

Further, in the present embodiment, the active region 401 pattern of the first pass transistor layout structure and the active region pattern of the second pass transistor layout structure are respectively located on the two sides below the active region pattern of the pull-down transistor layout structure. Further, in the disclosure, the contact hole patterns of the pull-down transistor layout structure are distributed above and below the polysilicon pattern of the pull-down transistor layout structure.

Further, in the disclosure, referring to FIG. 4, the polysilicon patterns 402 of the first pass transistor layout structure and the second pass transistor layout structure are connected together, and connected regions outside respective active regions are covered with polysilicon cutoff patterns 13.

Figure 6:
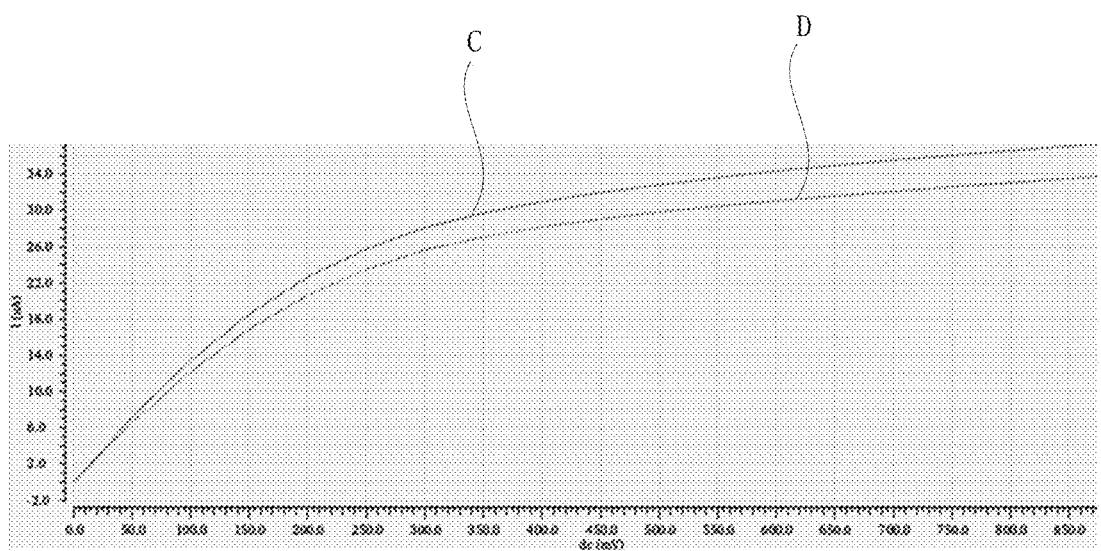
FIG. 6 illustrates a comparison data plot of the read-state voltages of internal nodes between the traditional bi-SRAM cell structure and the bi-SRAM cell using an SRAM layout structure according to the disclosure.

FIG. 6 illustrates the comparison data plot of read-state voltages of the internal nodes between the traditional bi-SRAM-cell structure and a bi-SRAM-cell using the SRAM layout structure according to the disclosure. Here curve C is the internal node voltage of the traditional bi-SRAM cell structure, and curve D is the internal node voltage of the bi-SRAM cell layout structure following the disclosure. FIG. 6 shows that the internal node voltage obtained by adopting the SRAM layout structure in the disclosure is smaller for the same SRAM area. A smaller internal node voltage leads to a more conducive device, thus improving the static noise margin.

The layout structure according to embodiment 2 of the disclosure is based on a dual-port SRAM cell of a low-power-consumption process in advanced technology node. That is to say, Based on the advanced low-power-consumption process, the dual-port SRAM cell layout is optimized to obtain an array with the SRAM device layout having the smallest area. Compared with the traditional layout, with the same area, the size of the pass transistor is kept at about 0.14 µm, and the size of the pull-down transistor is increased to about 0.48 µm from about 0.3 µm. In the layout of a multi-project-wafer or (MPW), the SRAM structure layout test keys are loaded and the specific performance in the actual process is verified.

To sum up, an optimized layout design is described above. s The disclosed layout enables the dual-port SRAM cell to avoid the influence of the optical fillet effect on the layout. At the same time, through layout optimization, under the same device unit area, the read current of the pull-down transistor is increased, the crosstalk in the reading and writing process is improved, and the performance of the transistor is strengthened. Therefore, the disclosure effectively overcomes various disadvantages in the current SRAM devices and the new device can be utilized in the semiconductor process. The above embodiments are only used for describing the principle and effect of the disclosure, instead of limiting the disclosure. Any person familiar with the technology may modify or change the above embodiments without departing from the spirit and scope of the disclosure. Therefore, all equivalent modifications or changes completed by those with ordinary knowledge in the technical field without departing from the spirit and technical thought disclosed in the disclosure shall still be covered by the claims of the disclosure.

What is claimed is:

1. A dual-port static random access memory cell layout structure, comprising:
   a pull-down transistor layout structure, comprising a pull-down active region pattern, a pull-down polysilicon pattern, and a pull-down contact hole pattern, wherein the pull-down polysilicon pattern crosses the pull-down active region pattern, wherein the pull-down contact hole pattern is located in the pull-down active region pattern and distributed on one side of the pull-down polysilicon pattern;
   a first pass transistor layout structure, comprising a first active region pattern, a first polysilicon pattern, and a first contact hole pattern, wherein the first polysilicon pattern crosses the first active region pattern, wherein the first contact hole pattern is located in the first active region pattern and distributed on one side of the first polysilicon pattern; and
   a second pass transistor layout structure, comprising a second active region pattern, a second polysilicon pattern, and a second contact hole pattern, wherein the second polysilicon pattern crosses the second active region pattern, wherein the second contact hole pattern is located in the second active region pattern and distributed on one side of the second polysilicon pattern;
   wherein the pull-down active region pattern of the pull-down transistor layout structure and the first active region pattern of the first pass transistor layout structure are connected together and the pull-down contact hole pattern and the first contact hole pattern are shared at one end;
   wherein the pull-down active region pattern of the pull-down transistor layout structure and the second active region pattern of the second pass transistor layout structure are connected together and the pull-down contact hole pattern and the second contact pattern are shared at another end;
   wherein the first active region pattern of the first pass transistor layout structure and the second active region pattern of the second pass transistor layout structure are respectively located on two sides below the pull-down active region pattern of the pull-down transistor layout structure.

2. The dual-port static random access memory cell layout structure according to claim 1, wherein the pull-down contact hole patterns of the pull-down transistor layout structure are distributed above and below the pull-down polysilicon pattern of the pull-down transistor layout structure.

3. The dual-port static random access memory cell layout structure according to claim 2, wherein the number of the pull-down contact hole patterns distributed above the pull-down polysilicon pattern of the pull-down transistor layout structure is one.

4. The dual-port static random access memory cell layout structure according to claim 3, wherein a number of contact hole patterns distributed below the pull-down polysilicon pattern of the pull-down transistor layout structure is two, and wherein the two contact hole patterns are respectively shared by the first pass transistor layout structure and the second pass transistor layout structure.

5. The dual-port static random access memory cell layout structure according to claim 1, wherein the first polysilicon pattern of the first pass transistor layout structure and the second pass transistor layout structure are connected together outside the first and the second active regions respectively and are covered with polysilicon cutoff patterns.

6. The dual-port static random access memory cell layout structure according to claim 4, wherein the first contact hole patterns above the first polysilicon patterns of the first pass transistor layout structure and the second contact hole patterns above the second polysilicon second pass transistor layout structure are respectively shared with the pull-down transistor layout structure, and wherein a number of contact holes below the first polysilicon pattern of the first pass transistor layout structure is one; and wherein a number of contact holes below the second polysilicon pattern of the second pass transistor layout structure is one.

7. The dual-port static random access memory cell layout structure according to claim 1, wherein the pull-down active region pattern of the pull-down transistor layout structure, the first active region pattern of the first pass transistor layout structure, and the second active region pattern of the second pass transistor layout structure are active region patterns of a static random access memory (SRAM) structure.

8. The dual-port static random access memory cell layout structure according to claim 7, wherein each of the active region patterns of the pull-down transistor layout structure, the first active region pattern of the first pass transistor layout structure and the second active region pattern of the second pass transistor layout structure comprises a plurality of strip structures intersecting with respective polysilicon patterns.

9. The dual-port static random access memory cell layout structure according to claim 8, wherein the first active region pattern of the first pass transistor layout structure and the second active region pattern of the second pass transistor layout structure are respectively located on the two sides below the pull-down active region pattern of the pull-down transistor layout structure.

10. The dual-port static random access memory cell layout structure according to claim 9, wherein the pull-down contact hole pattern of the pull-down transistor layout structure are distributed above and below the pull-down polysilicon pattern of the pull-down transistor layout structure.

11. The dual-port static random access memory cell layout structure according to claim 7, wherein the first polysilicon pattern of the first pass transistor layout structure and the second polysilicon pattern of the second pass transistor layout structure are connected together outside respective active regions, and wherein the first and second polysilicon patterns are covered with polysilicon cutoff patterns.

12. The dual-port static random access memory cell layout structure according to claim 10, wherein a size of the first pass transistor is 0.14 μm and a size of the second pass transistor is also 0.14 μm.

13. The dual-port static random access memory cell layout structure according to claim 10, wherein a size of the pull-down transistor is 0.48 μm.

14. The dual-port static random access memory cell layout structure according to claim 1, wherein a layout structure is based on the dual-port static random access memory cell of a low-power-consumption process of an advanced technology node.

* * * * *